United States Patent [19]
Kikuchi

[11] Patent Number: 5,270,774
[45] Date of Patent: Dec. 14, 1993

[54] TESTING DEVICE FOR ELECTROPHOTOGRAPHIC IMAGING APPARATUS

[75] Inventor: Shinji Kikuchi, Saitama, Japan

[73] Assignee: Asahi Kogaku Kogyo Kabushiki Kaisha, Tokyo, Japan

[21] Appl. No.: 901,164

[22] Filed: Jun. 19, 1992

[30] Foreign Application Priority Data

Jun. 19, 1991 [JP] Japan .............................. 3-077244[U]

[51] Int. Cl.$^5$ .......................................... G03G 15/00
[52] U.S. Cl. .................... 355/203; 355/209; 358/406; 395/113
[58] Field of Search ...................... 355/206, 203–205, 355/209; 358/206, 406; 371/16.4, 27, 29.1; 395/113

[56] References Cited

U.S. PATENT DOCUMENTS

| | | | |
|---|---|---|---|
| 4,483,002 | 11/1984 | Groom, Jr. et al. | 371/29.1 |
| 4,742,483 | 5/1988 | Morrell | 371/16.4 X |
| 4,774,524 | 9/1988 | Warbus et al. | 346/44 |
| 4,989,163 | 1/1991 | Kawamata et al. | 395/106 |
| 5,027,135 | 6/1991 | Negishi et al. | 346/154 |

FOREIGN PATENT DOCUMENTS

| | | |
|---|---|---|
| 0481518 | 4/1992 | European Pat. Off. |
| 2067307 | 7/1981 | United Kingdom |
| 2238640 | 6/1991 | United Kingdom |

Primary Examiner—Joan H. Pendegrass
Attorney, Agent, or Firm—Sandler Greenblum & Bernstein

[57] ABSTRACT

An electrophotographic imaging apparatus has an engine driver board and a printer controller that are connectable to the engine driver. A testing device is connected to the engine driver board in order to test and/or monitor the operational function of the imaging apparatus by communicating with the engine driver board. In the imaging apparatus, the printer controller is disconnected from the engine driver when the testing device is connected to the engine driver board when a testing operation is performed. On the other hand, the connection between the engine driver board and the printer controller is maintained when the testing device is connected to the engine driver board merely to display the operational condition of the imaging apparatus without performing the testing operation.

17 Claims, 3 Drawing Sheets

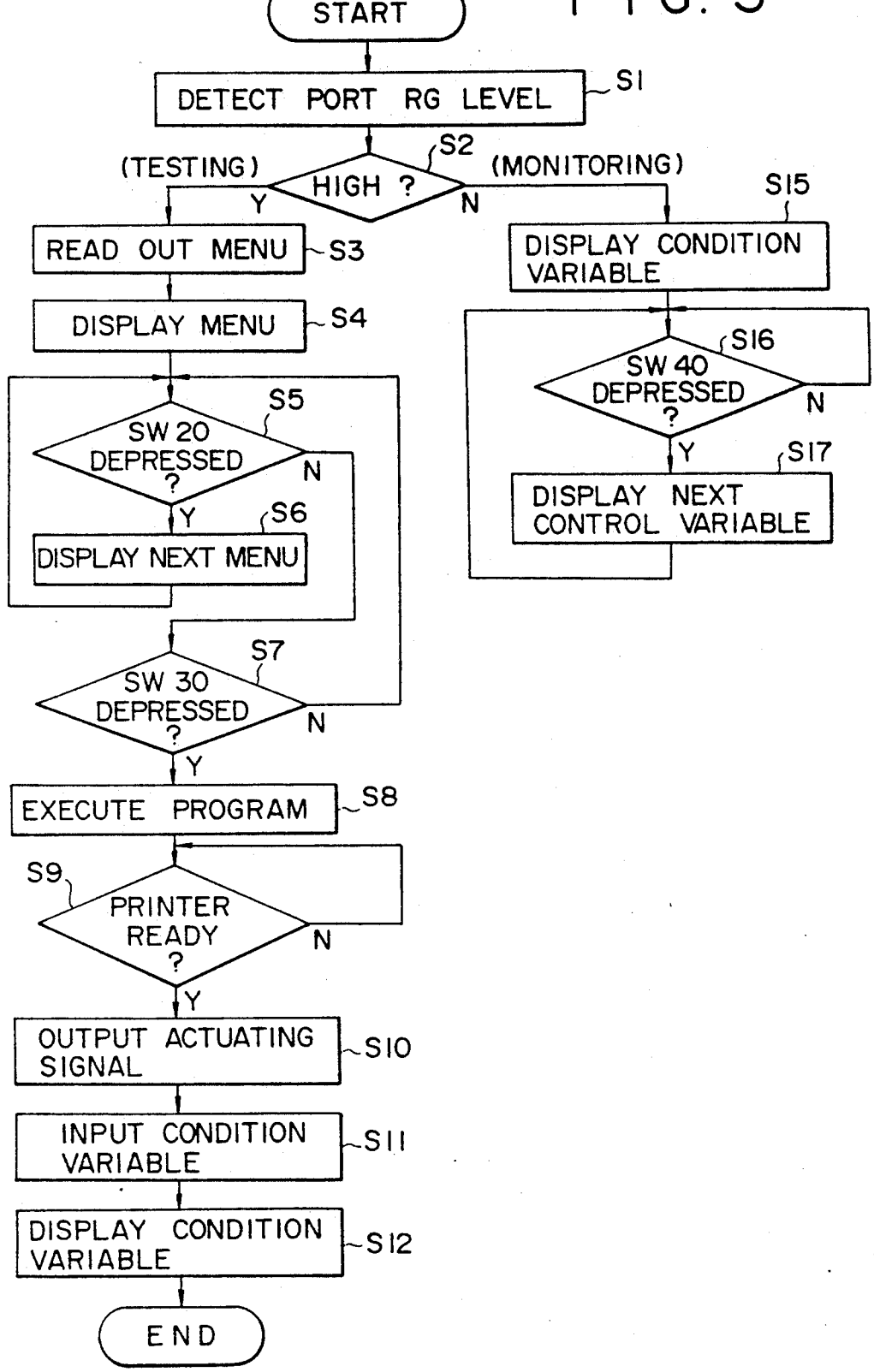

TESTING DEVICE FOR ELECTROPHOTOGRAPHIC IMAGING APPARATUS

BACKGROUND OF THE INVENTION

The present invention relates to a testing device for testing functional units, such as an exposing unit, a developing unit, a transferring unit, a fixing unit, and a paper feeding system of an electrophotographic imaging apparatus.

Conventionally, there has been known an imaging apparatus employing a so-called electrophotographic imaging method, such as an electronic copy machine and a laser beam printer, etc. In such an electrophotographic imaging apparatus, an exposure operation is performed by an exposing unit in such a manner that a uniformly charged surface of a photoconductive drum is exposed to light to form a latent image on the basis of Image information. Then, a developing unit attaches toner onto the latent image so as to form a toner image. The toner image is transferred onto a recording paper by a transferring unit. Subsequently, the transferred image is fixed onto a recording sheet by a fixing section.

Generally, an electrophotographic imaging apparatus includes: an engine driver board for receiving data from a host computer, or the like, and for driving each of the functional units, such as, for example, an exposing unit, a developing unit, a transfer unit, a fixing unit, etc.; and a printer controller for supplying data relating to an image to be printed, for example, such as, for example, a video signal, page-size data, etc. to the engine driver board.

In the printing operation of the electrophotographic imaging apparatus, data communication is performed between the printer controller and the engine driver board in such a fashion that the printer controller outputs data relating to an image to be printed in response to the requirement of the engine driver board. Then, the engine driver drives each function unit with reference to data representing an operational condition, such as, for example, a sheet-feed condition, temperature of the fixing unit, etc., of the function units.

In an assembly line of the electrophotographic imaging apparatus, a performance test is required for checking a basic function of each of the function units of the imaging apparatus, such as, a sheet-feed function, temperature control function, and so on. When the performance test is executed, the engine driver and the printer controller are disconnected, and an external testing device is connected to the engine driver board for communicating the engine driver board instead of the printer controller. Then, the testing device performs checking of basic function of the individual imaging apparatus by sending the data relating to an image, which is selected as suitable for testing purposes, to the engine driver board.

As described above, since each functional unit is driven based on the communication between the testing device and the engine driver board, the printer controller in the electrophotographic imaging apparatus is conventionally disconnected from the engine driver board upon connection of the testing device to the engine driver board.

In order to develop a new printer controller or Improving a conventional printer controller, it is preferable that the operational condition of the function units of the imaging apparatus be monitored with the print controller and the engine driver board being connected.

When an actual printing operation is executed without the testing device, that is, the engine driver is connected with the printer controller, since the operational condition of each function unit is transmitted only between the engine driver board and the printer controller, it is difficult to monitor the operational condition of the function units from outside.

Some imaging apparatus are equipped with display devices that are directly connected to the printer controller, so as to display some operational condition of the imaging apparatus. This type of display does, however, display only a limited and predetermined number of operational conditions of the imaging apparatus.

On the other hand, the testing device is capable of displaying sufficient numbers of operational conditions of the function units obtained from the engine driver board. However, since the testing device is used for testing the engine driver board, and the printer controller should be disconnected from the testing device when the engine drive and the testing device are connected, it is difficult to monitor the operational conditions of the function units of the imaging apparatus with use of the testing device when the print controller and the engine driver board is connected.

SUMMARY OF THE INVENTION

It is therefor an object of the present invention to provide an improved testing device for an electrophotographic imaging apparatus capable of performing either the checking operational conditions of each functional units or the testing operation of the imaging apparatus.

For the above object, according to the present invention, there is provided a combination of an imaging apparatus having an engine driver and a controller that is connectable to the engine driver, a testing device being connectable to the engine driver for communicating with the engine driver for testing and/or monitoring an operational function of the imaging apparatus, in which the combination comprises disconnecting the controller from the engine driver when the testing device is connected to the engine driver for test purposes, and disabling the disconnecting of the controller from the engine driver when the testing device is to monitor the imaging apparatus to display an operational condition of the imaging apparatus.

According to another aspect of the present invention, there is provided a testing device that is connectable to an imaging apparatus an which is capable of performing at least one of a testing or monitoring operation for testing or monitoring an operational condition of the imaging apparatus, in which the imaging apparatus comprises an engine driver that controls a driving of functional units of the imaging apparatus and a controller that supplies data relating to an image to be printed to the engine driver, the imaging apparatus executing a printing operation in accordance with a data exchange between the engine driver and the controller, the testing device comprising selecting either the testing or the monitoring operations, in which the controller is disconnected from the engine driver when the testing operation is selected so that the testing device can test the functional units, receiving data exchanged between the engine driver and the controller when the monitoring operation is selected, and displaying information corresponding to the data received by the receiving means.

Optionally, the testing device is capable of selectively requiring one of a plurality of kinds of information to be displayed. The present invention further comprises means for determining one of the kinds of information, and means for requiring the imaging apparatus to output data corresponding to the selected plurality of kinds of information.

According to a still further aspect of the present invention, there is provided an imaging apparatus comprising an engine driver and a controller, the imaging apparatus performing a printing operation in accordance with data exchanged between the engine driver and the controller, the imaging apparatus further comprising means for externally outputting data exchanged between the engine driver and the controller when the printing operation is performed.

DESCRIPTION OF THE ACCOMPANYING DRAWINGS

FIG. 3 is a flow chart showing an operation of the testing device embodying the present invention.

DESCRIPTION OF THE EMBODIMENTS

Figure 1:
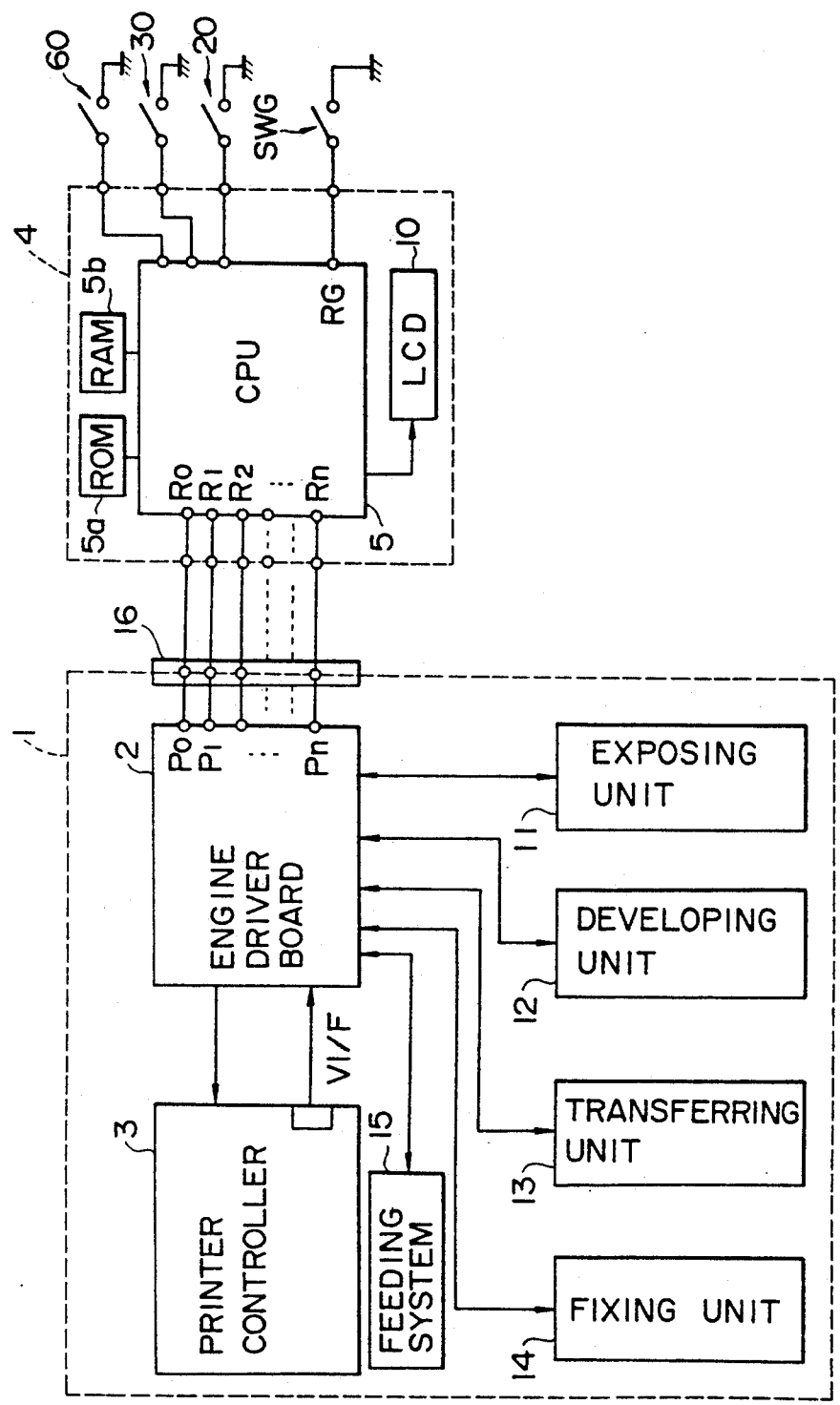
FIG. 1 is a schematic block diagram showing an electrophotographic printer and a testing device employing the present invention.

FIG. 1 is a schematic block diagram showing an electrophotographic printer I and a testing device 4 embodying the present invention.

The electrophotographic printer 1 includes various functional units, such as, an exposing unit 11, a developing unit 12, a transferring unit 13, a fixing unit 14, a recording paper feeding system 15, etc.

The functional units are respectively connected to an engine driver board 2 of the printer 1 so as to be controlled thereby. The engine driver board 2 is connected to a printer controller 3. The printer controller 3 and the engine driver board 2 transmits data representing operational conditions of the functional units. Further, the printer controller 3 supplies data relating to an image to be printed, such as, a video signal, page-size data, etc. to the engine driver board 2.

A remote controller 4 that serves as a testing device, is detachably connected to the electrophotographic printer 1 for communicating with the engine driver board 2. In order to carry out a communication with the remote controller 4, the engine driver board 2 has a plurality of data transmitting ports P0, P1 —, Pn.

The remote controller 4 has a CPU (Central Processing Unit) 5 for performing a testing operation, and is provided with associated ROM 5a and RAM 5b. The CPU 5 has a plurality of data transmitting terminals R0, R1, —, Rn that are respectively connected to ports P0, P1, —, Pn of the engine driver board 2.

The remote controller 4 further includes an LCD display (Liquid Crystal Display) 10. The LCD display 10 is connected to the CPU 5 and displays information relating to a monitoring and testing operation of the remote controller 4.

The CPU 5 is provided with a port RG, which is connected to a manual switch SWG that is manipulated by an operator. Switch SWG serves as a means for selecting operation mode of the remote controller 4. If switch SWG is opened, the port RG is applied with a predetermined voltage (hereinafter, referred to as H-level), and If the switch SWG Is closed, the port RG is grounded (hereinafter, referred to as L-level). The H/L level information of the port RG is transmitted from terminal Rn of the CPU 5 to port Pn of the engine driver board 2.

The CPU 5 is connected with manually operated switches 20, 30, and 60, so as to receive signals therefrom. Switch 20 is a menu switch to select one of a plurality of menus. Switch 30 is a start switch to start a performance test of the selected menu. Switch 60 is a monitor switch to select a monitor item to be displayed on the LCD 10.

The system of the electrophotographic printer 1 is organized in such a manner that the printer controller 3 is electrically disconnected from the engine driver board 2 when the engine driver board 2 receives the H-level signal. That is, as far as the level of terminal Rn (i.e. the level of the port Rn) is a H-level, the printer controller 3 cannot communicate with the engine driver board 2. In other words, when the remote controller is connected to the engine driver 2, communication between the engine driver 2 and the printer controller 3 is disabled.

Figure 2:
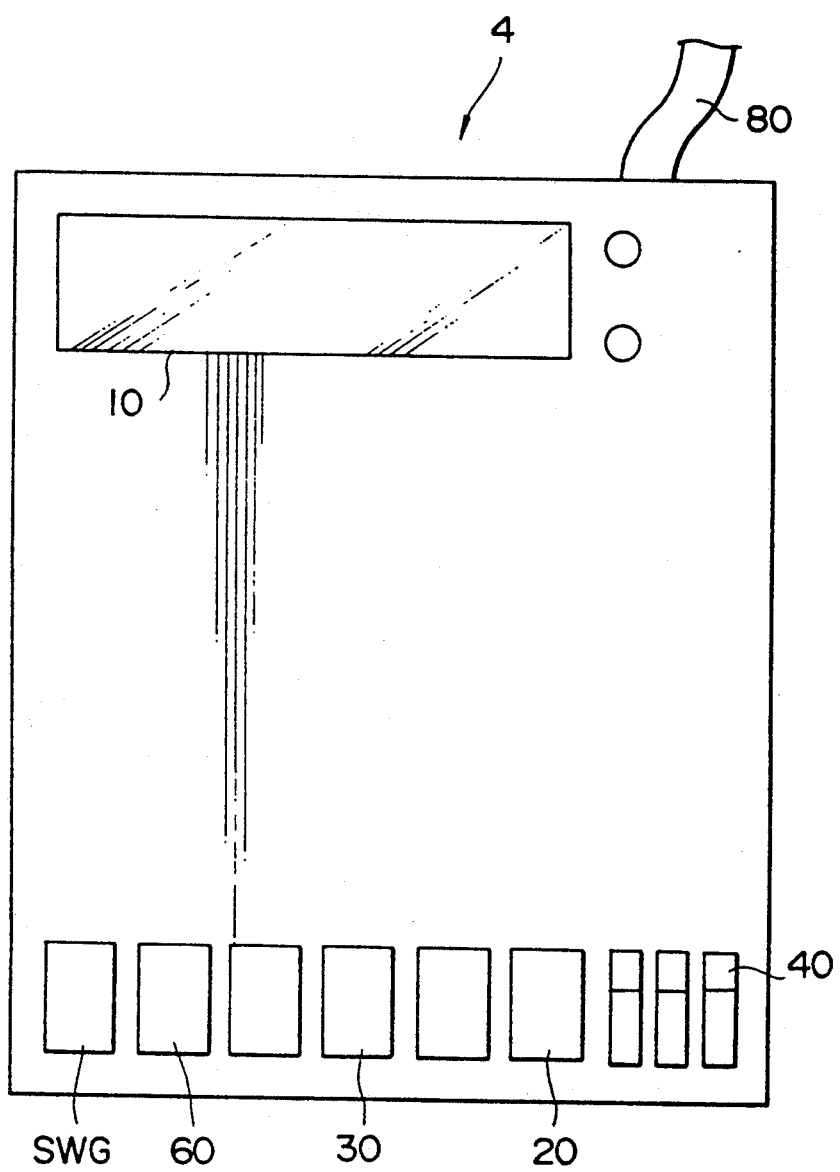
FIG. 2 is a front view showing the testing device embodying the present invention.

FIG. 2 is a front view showing the remote controller 4. The remote controller 4 is connected through a cable 80 to the electrophotographic printer 1. In more detail, this cable 80 is directly engaged with an interface circuit 16 provided in the electrophotographic printer 1. The interface circuit 16 is associated with the engine driver board 2 so as to exchange data to each other.

On the surface of the remote controller 4, the previously explained LCD display 10 and the switches SWG, 20, 30, and 60 are disposed in a line at the lower part of the surface of the remote controller 4. The LCD display 10 is disposed at an upper part of the surface of the remote controller 4.

When the remote controller 4 is used as a testing device, an operator manipulates the merits switch 20 to select a desired testing item while watching the LCD 10. When the menu switch 20 Is closed by the manipulation, the CPU 5 reads out a menu from its associated ROM 5a one by one, and supplies a display command signal to the LCD display 10 to display the menu so that the operator can clearly recognize the menu and easily select the desired testing item.

Then, by closing the start switch 30, a testing operation of the printer 1 can be initiated in accordance with the selected testing item.

The data transmitted between the engine driver board 2 and the remote controller 4 are data relating to printing command signals, horizontal synchronous signal, vertical synchronous signal, image signal, and so on. Further, serial communication is also performed such that testing commands are transmitted from the remote controller 4 to the engine driver board 2, and data representing the operational condition of each of the function units which are driven by the engine driver board 2 is transmitted from the engine driver board 2 to the remote controller 4.

FIG. 3 is a flow chart illustrating the performance of the remote controller 4.

After the remote controller is turned ON, the voltage level of the RG port is detected in step S1. If, in step 2, it is determined that the port RG is a H-level, a performance test is executed.

In step S3, the CPU 5 reads a menu from the ROM 5a and sends a command signal to the LCD display 10 to display the menu in step S4. Subsequently, the CPU 5 waits until an operator manipulates the menu switch 20 or the start switch 30.

That is, it is checked in step S5 whether the menu switch 20 is depressed. If it is not depressed, in step S7, it is further checked whether the start switch 30 is depressed. If the judgment in step S7 is NO, the process returns to step S5. Thus, steps S5 and S7 are repeatedly executed until either switch 20 or 30 is depressed by the operator.

If the operator pushes the menu switch 20, the next menu is displayed on the LCD display 10. Thus, the operator can select a desired menu (steps S5, S6).

If the operator pushes the start switch 30, the CPU 5 sends a request to the ROM 5a to supply a test program to be executed in step S8. Namely, the operator can initiate the performance test by simply touching the start switch 30.

Then, the CPU 5 checks step S9 whether the electrophotographic printer 1 is ready. In this case, both the remote controller 4 and the electrophotographic printer 1 need to confirm with each other if the mutual conditions are ready to start the test. Therefore, the CPU 5 sends a test mode signal to the engine drive board 2. If it is in a ready condition, the engine drive board 2 responds to this signal and returns a response signal to the CPU 5. Thus, it can be confirmed that both of the remote controller 4 and the electrophotographic printer 1 are connected together so as to allow a data exchange for testing the engine driver 2.

If the CPU 5 does not receive the response signal from the engine driver 2 in step S9, it waits until the printer 1 becomes ready. When the CPU 5 receives the response signal from the engine driver board 2 in step S9, an actuating signal is outputted from the testing device 4 in step S10. In response to this actuating signal, the engine drive board 2 sends data representing operational conditions of the function units in step S11. Then, the operational conditions are displayed on the LCD display 10 so that the operator can cheek the result of the performance test by means of the display on the LCD 10.

Items for the performance test are: a check for printed characters; an action check for various mechanism portions in the printer; a power adjustment for an optical system (a laser scanning system); a temperature control test for a fixing unit; a paper feeding test and so on.

If the judgment In step S2 is NO, a monitoring function is executed in steps S15 through S17. That is, when the remote controller 4 is turned ON with the switch SWG being opened, the remote controller 4 functions as a testing device. On the contrary, if the remote controller is turned ON with the switch SWG being closed, the remote controller 4 functions as a monitoring device.

When the remote controller 4 functions as a testing device, a H-level signal is sent from terminal Rn of the CPU 5 to the port Pn of the engine driver board 2. The system of the printer 1 is constituted so as to disconnect the printer controller 3 from the engine driver board 2 when it receives the H-level signal from the terminal Rn of the CPU 5. Therefore, the printer I is actuated on the basis of the communication between the remote controller 4 and the engine drive board 2.

When the remote controller 4 functions as a monitoring device, a L-level signal is sent from terminal Rn of the CPU 5 to port Pn of the engine drive board 2. The system of the printer I does not disconnect the printer controller 3 from the engine driver board 2 when it receives the L-level signal from terminal Rn of the CPU 5. Therefore, the printer 1 is actuated on the basis of the communication between the printer controller 3 and the engine driver board 2 as well as a normal printing operation. In this case, the signal allowed to be supplied from the CPU 5 of the remote controller 4 to the engine driver board 2 Is limited only to a signal requesting data transmission from the engine driver 2 to the remote controller 4. In response to this request, the engine driver board 2 sends data relating to operational conditions of the printer to the CPU 5. If the remote controller received the data relating to the operational conditions, the CPU 5 sends a command to the LCD display 10 to display the information relating the operational condition based upon the received data.

That is, in step S15, the information relating to the operational condition is displayed. In step S16, the item of the data relating to the operational conditions to be transmitted is changed by successively pushing the monitor switch 40 until the desired monitor item is selected.

As is explained in the foregoing description, if the remote controller 4 functions as a monitor, the printing operation is carried out based on the communication between the engine driver board 2 and the printer controller 3 as well as the usual printing operation. Therefore, it becomes possible to monitor the operational conditions of the printer 1 from outside while using the printer controller 3.

According to the remote controller embodying the present invention, it is not required to provide an exclusive interface for monitoring the printer 1, because the remote controller 4 can be used as the monitoring device as well as the testing apparatus.

As this invention may be embodied in several forms without departing from the spirit of essential characteristics thereof, the present embodiment is therefore illustrative and not restrictive, since the scope of the invention is defined by the appending claims rather than by the description preceding them, and all changes that fall within the meets and bounds of the claims, or equivalence of such meets and bounds are therefore intended to embraced by the claims.

The present disclosure relates to subject matter contained in Japanese Utility Model Application No. HEI 3-77244, filed on Jun. 19, 1991, which is expressly incorporated herein by reference in its entirety.

What is claimed is:

1. A combination of:
an electrophotographic imaging apparatus having an engine driver and a controller that is electrically connectable to said engine driver, said engine driver controlling a driving of functional units of said electrophotographic imaging apparatus, said controller supplying data relating to an image to be provided to said engine driver; and
a testing device that is connectable to said engine driver, said testing device being capable of communicating with said engine driver, and of at least testing or monitoring an operational function of said electrophotographic imaging apparatus by communicating with said engine driver, said combination comprising:
means for electrically disconnecting said controller from said engine driver when said testing device is connected to said engine driver for testing said engine driver; and means for disabling said disconnecting means when said testing device is connected to said engine driver for monitoring an operational function, so as to display an operational condition of said imaging apparatus without performing said testing of said engine driver.

2. The combination of claim 1, wherein said testing device is capable of being actuated in a first mode, in which both said testing and monitoring operations are executed, and in a second mode, in which only said monitoring operation is executed, and wherein said testing device comprises means for selecting at least one of said first and second modes.

3. The combination of claim 2, wherein said testing device comprises means for outputting data indicating which one of said at least first and second modes has been selected, and wherein said electrophotographic imaging apparatus comprises means for receiving data that is outputted by said outputting means of said testing device.

4. The combination of claim 3, wherein said testing device comprises:
means for determining an item to be monitored; and
means for sending a request signal to said engine driver in order to request data corresponding to said item determined by said determining means,
wherein said imaging apparatus comprises means for receiving said request signal; and
means for outputting said data upon receipt of said request signal.

5. The combination of claim 1, wherein said testing device comprises means for displaying condition information corresponding to said data received from said engine driver.

6. The combination of claim 1, wherein said disconnecting means is provided with said imaging apparatus.

7. A testing device that is connectable to an electrophotographic imaging apparatus, and which is capable of performing at least one of a testing or monitoring operation for testing or monitoring an operational condition of said electrophotographic imaging apparatus, said electrophotographic imaging apparatus comprising an engine driver that controls a driving of functional units of said electrophotographic imaging apparatus and a controller that supplies data relating to an image to be printed to said engine driver, said imaging apparatus executing a printing operation in accordance with a data exchange between said engine driver and said controller, said testing device comprising:
means for selecting at least one of said testing and monitoring operations, in which said controller is electrically disconnected from said engine driver when said selecting means selects said testing operation so that said testing device can test said functional units;
means for receiving data exchanged between said engine driver and said controller when said monitoring operation is selected; and
means for displaying information corresponding to said data received by said receiving means.

8. The testing device of claim 7, wherein said testing device is capable of selectively requiring one of a plurality of kinds of information to be displayed, and wherein said testing device further comprises means for determining one of said plurality of kinds of information, and means for requiring said electrophotographic imaging apparatus to output data corresponding to a selected one of said plurality of kinds of information.

9. The testing device of claim 7, wherein said testing device is connected to said engine driver.

10. The testing device of claim 7, wherein said testing device comprises:
means for determining an item to be monitored; and
means for sending a request signal to said engine driver to request data corresponding to said item determined to be monitored.

11. The testing device of claim 10, wherein said imaging apparatus outputs said data upon receiving said request signal.

12. The testing device of claim 7, further comprising means for displaying condition information corresponding to said data received from said engine driver.

13. An imaging apparatus, comprising an engine driver that controls an operational function of said imaging apparatus and a controller that supplies data relating to an image to be provided to said engine driver, said imaging apparatus performing a printing operation in accordance with data that is exchanged between said engine driver and said controller, said imaging apparatus further comprising:
means for externally outputting said data exchanged between said engine driver and said controller when said printing operation is performed so as to display an operational function of said imaging apparatus; and
means for electrically disconnecting said controller from said engine driver to enable a testing of at least one functional unit of said imaging apparatus.

14. A device for monitoring and testing an imaging apparatus having an engine driver that controls functional units of said imaging apparatus and a controller that supplies data relating to an image to be provided to said engine driver, comprising:
a selector that selects whether said monitoring and testing device should communicate with said engine driver to determine the condition of various functional units of said imaging device or whether said monitoring and testing device should communicate with said engine driver to display signals representing operational functions of said imaging device;
means for electrically disconnecting said controller from said engine driver when said selector selects that said monitoring and testing device is connected to said engine driver to test said imaging apparatus; and
means for disabling and disconnecting means when said selector selects that said monitoring and testing device is connected to said engine driver for displaying signals representing operational functions of said imaging device.

15. The device of claim 14, further comprising:
means for determining an item to be tested; and
means for sending a request signal to said engine driver to request data corresponding to said item to be tested determined by said determining means.

16. The device of claim 15, wherein said imaging apparatus outputs said data corresponding to said item to be tested upon receipt of said request signal.

17. The device of claim 16, further comprising a display that displays condition information corresponding to said data received from said imaging apparatus.

* * * * *

UNITED STATES PATENT AND TRADEMARK OFFICE
CERTIFICATE OF CORRECTION

PATENT NO. : 5,270,774
DATED      : December 14, 1993
INVENTOR(S): S. KIKUCHI

It is certified that error appears in the above-indentified patent and that said Letters Patent is hereby corrected as shown below:

At column 8, line 51 (claim 14, line 19) of the printed patent, change "and" to ---said---.

Signed and Sealed this

Fifth Day of November, 1996

Attest:

BRUCE LEHMAN

*Attesting Officer*     *Commissioner of Patents and Trademarks*